(12) United States Patent
Hu

(10) Patent No.: US 9,537,090 B1
(45) Date of Patent: Jan. 3, 2017

(54) PERPENDICULAR MAGNETIC ANISOTROPY FREE LAYERS WITH IRON INSERTION AND OXIDE INTERFACES FOR SPIN TRANSFER TORQUE MAGNETIC RANDOM ACCESS MEMORY

(71) Applicant: International Business Machines Corporation, Armonk, NY (US)

(72) Inventor: Guohan Hu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/749,770

(22) Filed: Jun. 25, 2015

(51) Int. Cl.
| | |
|---|---|
| *H01L 21/00* | (2006.01) |
| *H01L 43/12* | (2006.01) |
| *H01L 43/08* | (2006.01) |
| *H01L 43/10* | (2006.01) |

(52) U.S. Cl.
CPC ............. *H01L 43/12* (2013.01); *H01L 43/08* (2013.01); *H01L 43/10* (2013.01)

(58) Field of Classification Search
CPC .................................. H01L 43/08; H01L 43/10
USPC ............................................................ 438/3
See application file for complete search history.

(56) References Cited

U.S. PATENT DOCUMENTS

| | | | |
|---|---|---|---|
| 7,750,421 B2 | 7/2010 | Horng et al. | |
| 8,072,800 B2 | 12/2011 | Chen et al. | |
| 8,374,025 B1 * | 2/2013 | Ranjan | B82Y 10/00 365/148 |
| 8,772,886 B2 * | 7/2014 | Huai | B82Y 25/00 257/421 |
| 8,871,530 B1 | 10/2014 | Hu | |
| 8,946,834 B2 | 2/2015 | Wang et al. | |
| 2009/0108383 A1 * | 4/2009 | Horng | B82Y 10/00 257/421 |
| 2010/0148167 A1 | 6/2010 | Whig et al. | |
| 2011/0133299 A1 * | 6/2011 | Zhu | H01L 43/08 257/421 |
| 2011/0241138 A1 | 10/2011 | Hsieh et al. | |
| 2012/0241878 A1 | 9/2012 | Hu et al. | |
| 2012/0306034 A1 * | 12/2012 | Meng | H01L 43/08 257/421 |
| 2013/0075845 A1 * | 3/2013 | Chen | G11C 11/161 257/421 |
| 2013/0270523 A1 * | 10/2013 | Wang | H01L 43/10 257/30 |

(Continued)

OTHER PUBLICATIONS

Wen, Zhenchao, et al.; "Perpendicular Magnetization of Co2FeAl Full-Heusler Alloy Films Induced by MgO Interface"; Applied Physics Letters; vol. 98; p. 242507-1-242507-3; 2011.

(Continued)

*Primary Examiner* — Sonya D McCall Shepard
(74) *Attorney, Agent, or Firm* — Cantor Colburn LLP; Vazken Alexanian

(57) ABSTRACT

A method of making a spin-torque transfer magnetic random access memory device (STT MRAM) device includes forming a tunnel barrier layer on a reference layer; forming a free layer on the tunnel barrier layer, the free layer comprising a cobalt iron boron (CoFeB) alloy layer and an iron (Fe) layer; and performing a sputtering process to form a metal oxide layer on the Fe layer.

12 Claims, 5 Drawing Sheets

(56) References Cited

U.S. PATENT DOCUMENTS

| | | | |
|---|---|---|---|
| 2014/0021426 A1* | 1/2014 | Lee | H01L 43/02 257/1 |
| 2014/0145792 A1 | 5/2014 | Wang et al. | |
| 2015/0028440 A1* | 1/2015 | Liu | H01L 43/08 257/421 |
| 2015/0311431 A1* | 10/2015 | Zhou | H01L 43/08 257/421 |

OTHER PUBLICATIONS

Yoshikawa, Masatoshi, et al. ;"Tunnel Magnetoresistance Over 100% in MgO-Based Magnetic Tunnel Junction Films With Perpendicular Magnetic L10-FePt Electrodes"; IEEE Translation on Magnetics; vol. 44, No. 11; p. 2573-2576; 2008.

\* cited by examiner

PERPENDICULAR MAGNETIC ANISOTROPY FREE LAYERS WITH IRON INSERTION AND OXIDE INTERFACES FOR SPIN TRANSFER TORQUE MAGNETIC RANDOM ACCESS MEMORY

BACKGROUND

The present invention generally relates to spin-transfer torque magnetic random access memory (STT MRAM) devices, and more specifically to perpendicular magnetic anisotropy (PMA) materials in STT MRAM devices.

A STT MRAM device is a type of solid state, non-volatile memory device that uses tunneling magnetoresistance (TMR or MR) to store information. MRAM includes an electrically connected array of magnetoresistive memory elements, referred to as magnetic tunnel junctions (MTJs). Each MTJ includes a free layer and fixed/reference layer that each include a magnetic material. The free and fixed/reference layers are separated by a non-magnetic insulating tunnel barrier. The free layer and the reference layer are magnetically decoupled by the tunnel barrier. The free layer has a variable magnetization direction, and the reference layer has an invariable magnetization direction.

The MTJ stores information by switching the magnetization state of the free layer. When the free layer's magnetization direction is parallel to the reference layer's magnetization direction, the MTJ is in a low resistance state. Conversely, when the free layer's magnetization direction is antiparallel to the reference layer's magnetization direction, the MTJ is in a high resistance state. The difference in resistance of the MTJ indicates a logical '1' or '0', thereby storing a bit of information. The TMR of an MTJ determines the difference in resistance between the high and low resistance states. A relatively high difference between the high and low resistance states facilitates read operations in the MRAM.

The magnetization direction of the free layer may be changed by a spin-transfer torque (STT) switched write method, in which a write current is applied in a direction perpendicular to the film plane of the magnetic films forming the MTJ. The write current transfers spin angular momentum to the free layer which creates a torque to change (or reverse) the free layer's magnetization direction. During STT magnetization reversal, the write current for magnetization reversal is determined by the current density. As the surface area of the the MTJ becomes smaller, the write current for reversing the free layer's magnetization becomes smaller. Therefore, if writing is performed with fixed current density, the necessary write current becomes smaller as the MTJ size becomes smaller.

Compared to MTJs with in-plane magnetic anisotropy, layers with perpendicular magnetic anisotropy (PMA) can lower the necessary write current density. Thus, PMA materials lower the total write current used.

SUMMARY

In one embodiment of the present invention, a method of making a spin-torque transfer magnetic random access memory device (STT MRAM) device includes forming a tunnel barrier layer on a reference layer; forming a free layer on the tunnel barrier layer, the free layer comprising a cobalt iron boron (CoFeB) alloy layer and an iron (Fe) layer; and performing a sputtering process to form a metal oxide layer on the Fe layer.

In another embodiment, a method of making a STT MRAM device includes forming a tunnel barrier layer on a reference layer; forming a free layer on the tunnel barrier layer, the free layer comprising a magnetic layer, a CoFeB alloy layer, a spacer layer between the magnetic layer and the CoFeB alloy layer, and an Fe layer on the CoFeB alloy layer; and performing a sputtering process to form a metal oxide layer on the free layer.

Yet, in another embodiment, a method of making a STT MRAM includes forming a tunnel barrier layer on a reference layer; forming a free layer on the tunnel barrier layer, the free layer comprising a magnetic layer, a CoFeB alloy layer, a spacer layer between the magnetic layer and second CoFeB alloy layers, and an Fe layer disposed on the second CoFeB alloy layer; and performing a sputtering process to form a metal oxide layer on the free layer; wherein sputtering process comprises RF sputtering a metal oxide onto the Fe layer under a pressure in a range from about 0.1 to about 10 milli-Torr (mTorr).

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-3 illustrate various embodiments of STT MRAM devices according to the present invention, in which:

FIG. 1 illustrates a cross-sectional side view of a STT MRAM device utilizing CoFeB layers with PMA;

FIG. 2 illustrates a cross-sectional side view of a STT MRAM device with a free layer including an CoFeB layer and an Fe layer;

FIG. 3 illustrates a cross-sectional side view of a STT MRAM device with a free layer including a magnetic layer, a spacer layer, a CoFeB layer, and an Fe layer;

DETAILED DESCRIPTION

Figure 1:
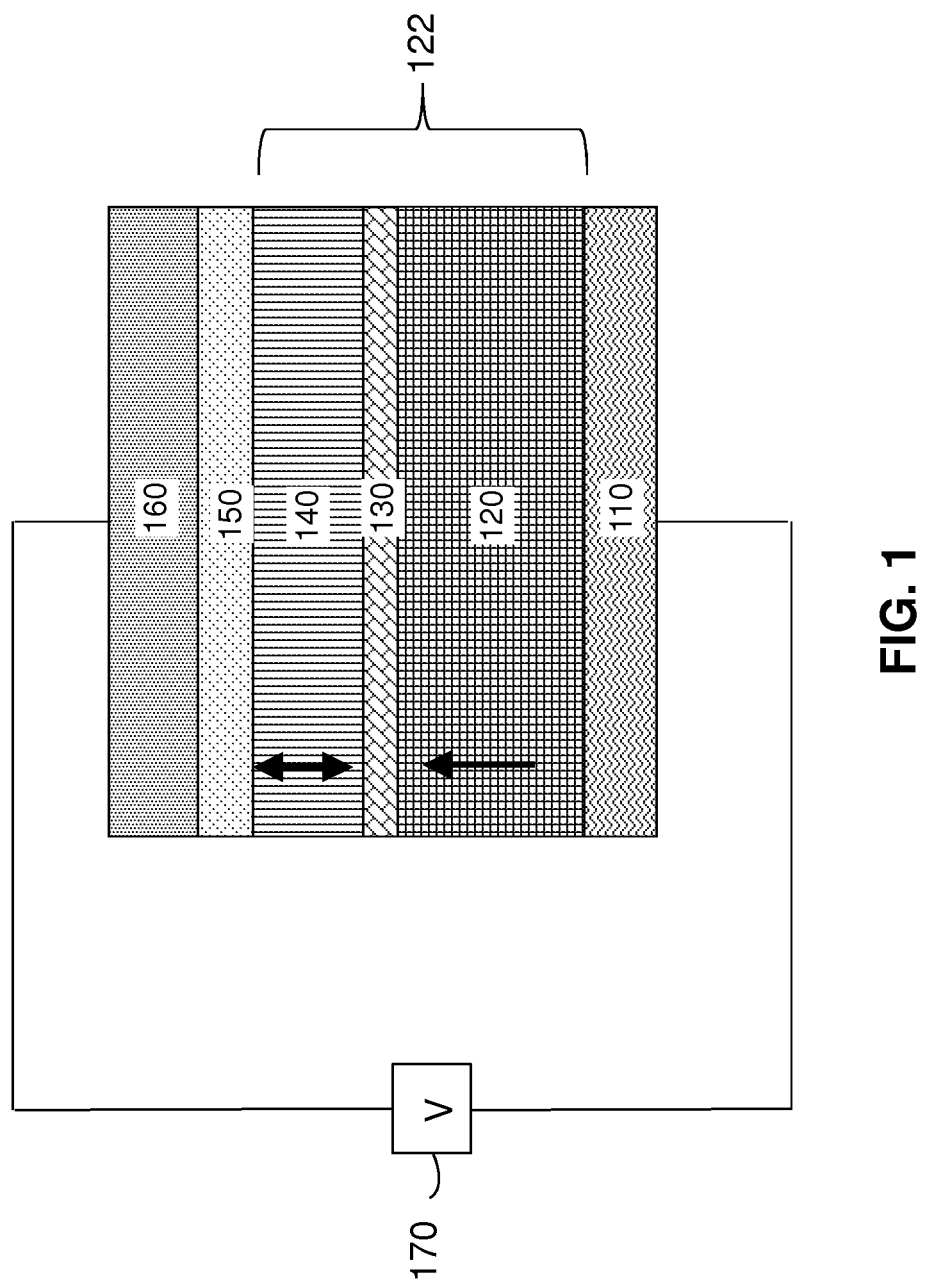

As stated above, the present invention relates to STT MRAM devices, and more specifically to PMA materials in STT MRAM devices. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the terms "atomic percent," "atomic %" and "at. %" mean the percentage of atoms of a pure substance divided by the total number of atoms of a compound or composition, multiplied by 100.

As used herein, the term "magnetic anisotropy" means the magnetization prefers to orient in a particular direction.

As used herein, the terms "perpendicular magnetic anisotropy" and "PMA" mean the magnetization prefers to orient perpendicular to the xy-plane. PMA can be determined by measuring magnetic hysteresis loops in both in-plane and out-of-plane directions.

Magnetic materials with PMA are useful for free layer applications in STT MRAM devices. However, STT devices with magnetic materials having both sufficiently strong PMA at a low switching current are a challenge.

Accordingly, the present invention solves the above problem by providing a method of making a STT MRAM device with desirable magnetic materials. The methods described provide STT MRAM devices with magnetic materials having sufficiently strong PMA at a low switching current (e.g., at least 50% higher switching efficiency compared to STT MRAM devices with free layers of CoFeB alone).

In particular, the inventive methods utilize sputtering processes to form an oxide cap over the free layer. The sputtering processes provide advantages of increased control over the oxide layer thickness and, therefore, improved control of the junction resistance-area (RA) product, as well as the distribution of the RA in patterned devices. Compared to initially depositing a metal layer and then oxidizing the metal layer by an oxidation process, as described herein, the oxide cap layer is formed by RF sputtering from an oxide target.

Figure 2:
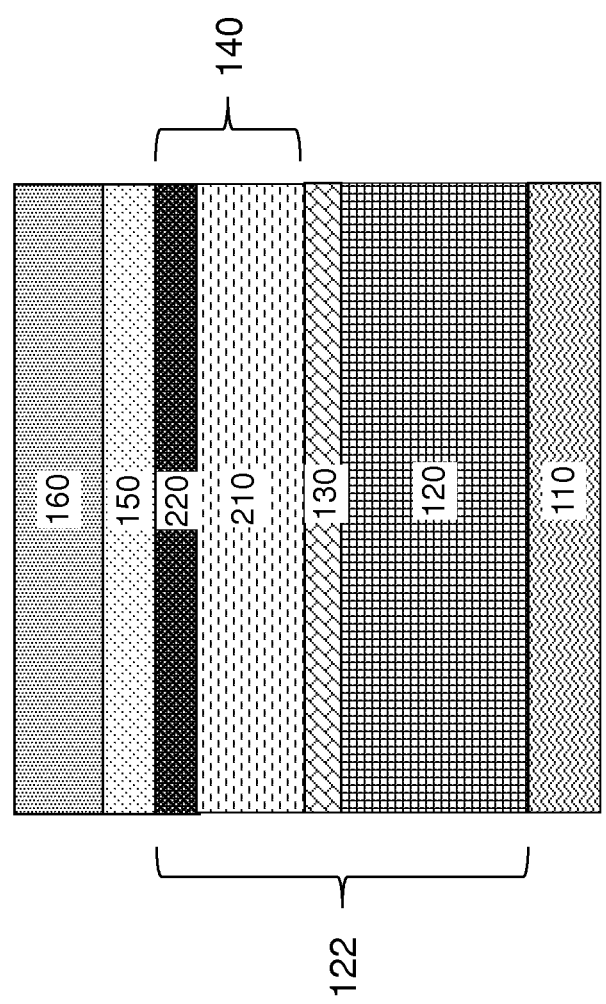
Figure 3:
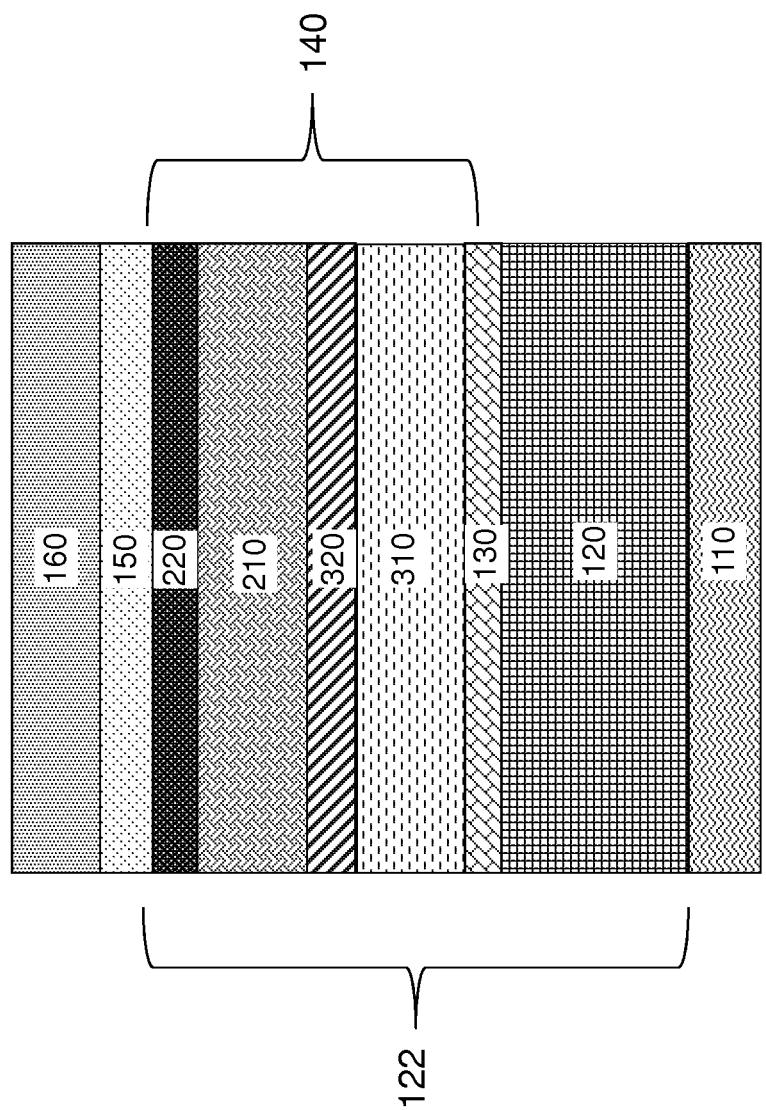

Turning now to the Figures, FIGS. 1-3 illustrate various embodiments of STT MRAM devices according to the present invention. FIG. 1 illustrates a cross-sectional side view of a STT MRAM device utilizing magnetic layers with PMA. The STT MRAM device includes a magnetic tunnel junction (MTJ) 122 over a seed layer 110. The MTJ 122 includes a reference layer 120, a tunnel barrier layer 130 on the reference layer 120, and a free layer 140 on the tunnel barrier layer 130.

The reference layer 120 and the free layer 140 are magnetic materials. The free layer 140 is described in further detail in FIGS. 2 and 3 below. The reference layer 120 may include any metal or metal alloys. Non-limiting examples of suitable materials for the reference layer 120 include cobalt (Co), iron (Fe), boron (B), nickel (Ni), iridium (Ir), platinum (Pt), palladium (Pd), or any combination thereof.

The thickness of the reference layer 120 is not intended to be limited. In one aspect, the thickness of the reference layer 120 is in a range from about 10 nanometers (nm) to about 20 nm. In another aspect, the thickness of the reference layer 120 is in a range from about 2 nm to about 10 nm. Yet, in another aspect, the thickness of the reference layer 120 is about or in any range from about 2, 4, 6, 8, 10, 12, 14, 16, 18, and 20 nm.

The free layer 140 is shown with double arrows to illustrate that spin torque current (or spin-polarized current) via voltage source 170 can flip the magnetic orientation of the free layer 140 to up or down as desired. The reference layer 120 is shown with an up arrow to illustrate a magnetic orientation in the up direction. To write the STT-RAM device, the voltage source 170 applies voltage such that a spin torque current may flip the magnetic orientation of the free magnetic layer 140 as desired. When the magnetic orientations of the free layer 140 and the reference layer 120 are parallel (i.e., pointing in the same direction), the resistance of the MTJ 122 is low (e.g., representing logic 0). When the magnetic orientations of the free layer 140 and the reference layer 120 are antiparallel (i.e., pointing in opposite directions), the resistance of the MTJ 122 is high (e.g., representing a logic 1).

One non-limiting example of a suitable material for the tunnel barrier layer 130 includes magnesium oxide (MgO). Any insulating material may be used in the tunnel barrier layer 130. The thickness of the tunnel barrier layer 130 is not intended to be limited. In one aspect, the thickness of the tunnel barrier layer 130 is in a range from about 0.5 nm to about 2 nm.

The seed layer 110 may include one or more different materials, depending on the composition of the reference layer 130, to grow the reference layer 120. Non-limiting examples of suitable materials for the seed layer 110 include NiCr, Ta, TaN, Pt, Pd, Ru, Ir, or any combination thereof. The thickness of the seed layer 110 is not intended to be limited. In one aspect, the thickness of the seed layer 110 is in a range from about 5 nm to about 10 nm. In another aspect, the thickness of the seed layer 110 is in a range from about 1 nm to about 5 nm. Yet, in another aspect, the thickness of the seed layer 110 is about or in any range from about 1, 2, 3, 4, 5, 6, 7, 8, 9, and 10 nm.

A metal oxide layer 150 is formed on the free layer 140. The metal oxide layer 150 is formed by a sputtering process. In one aspect, the sputtering process is a radio frequency (RF) sputtering process. During RF sputtering, a metal oxide is sputtered onto the free layer 140. Non-limiting examples of suitable metal oxides for forming the metal oxide layer 140 include MgO, tantalum oxide (TaOx), titanium oxide (TiOx), aluminum oxide (AlOx), magnesium titanium oxide (MgTiOx), or any combination thereof. The thickness of the metal oxide layer 150 is not intended to be limited. In one aspect, the thickness of the metal oxide layer 150 is in a range from about 0.2 to about 2 nm. Yet, in another aspect, the thickness of the metal oxide layer 150 is about or in any range from about 0.2, 0.4, 0.6, 0.8, 1.0, 1.2, 1.4, 1.6, 1.8, and 2.0 nm.

RF sputtering is performed under a pressure in a range from about 0.1 mTorr to about 10 mTorr. The deposition rate of the oxide cap material is controlled in a range from about 0.0005 nm/second to 0.005 nm/second. The low sputter rate provides precise control of the cap oxide layer thickness. The oxide material sputtered from the oxide target can be controlled provide the right stoichiometry without excessive oxygen or oxygen deficiency. Such control minimizes the interaction between the free layer material and oxide cap by taking advantage of the interface anisotropy. In contrast, when the oxide cap is formed by metal deposition followed by subsequent oxidation, it is difficult to control the oxidation process to provide stoichiometric oxide and to provide oxygen stops exactly at the free layer interface. As a result, the free layer can be easily oxidized and causes high RA, which is unfavorable.

Cap layer 160 is formed over the metal oxide layer 150. Non-limiting examples of suitable materials for the metal oxide layer 150 include ruthenium (Ru), Pd, Pd, Pt, Ta, titanium nitride (TiN), or any combination thereof. The thickness of the cap layer 160 is not intended to be limited. In one aspect, the thickness of the cap layer 160 is in a range from about 1 nm to about 10 nm.

The seed layer 110, reference layer 120, tunnel barrier layer 130, free layer, and cap layer 160 may be formed by any suitable deposition processes. Non-limiting examples of suitable deposition processes include physical vapor deposition (PVD), chemical vapor deposition (CVD), high density plasma CVD (HDP CVD), epitaxial growth, or other suitable deposition processes.

FIG. 2 illustrates a cross-sectional side view of a STT MRAM device with a free layer 140 including a CoFeB alloy layer 210 and an Fe layer 220. The STT MRAM device includes a MTJ 122 over a seed layer 110. The MTJ 122 includes a reference layer 120, a tunnel barrier layer 130 on the reference layer 120, and a free layer 140 on the tunnel barrier layer 130. The free layer 140 includes a CoFeB alloy layer 210 and an Fe layer 220 on the CoFeB alloy layer 210. The CoFeB alloy layer 210 and the Fe layer 220 are discrete layers that are strongly ferromagnetically coupled and switch as a single entity under spin torque currents. The Fe layer 220 substantially improves the PMA of the free layer 140.

The CoFeB alloy layer 210 includes boron (B) in amount in a range from about 5 to about 50 at. %. In another aspect, the CoFeB layer 210 include boron in an amount in a range from about 20 to about 30 at. %. Yet, in another aspect, the CoFeB alloy layer 210 includes boron in an amount about or in any range from about 5, 10, 15, 20, 25, 30, 35, 40, 45, and 50 at. %.

The CoFeB alloy layer 210 includes iron (Fe) in amount in a range from about 20 to about 80 at. %. In another aspect, the CoFeB layer 210 include iron in an amount in a range from about 20 to about 60 at. %. Yet, in another aspect, the CoFeB alloy layer 210 includes iron in an amount about or in any range from about 20, 25, 30, 35, 40, 45, 50, 55, 60, 65, 70, 75, and 80 at. %.

The CoFeB alloy layer 210 includes cobalt (Co) in amount in a range from about 10 to about 50 at. %. In another aspect, the CoFeB layer 210 include cobalt in an amount in a range from about 20 to about 30 at. %. Yet, in another aspect, the CoFeB alloy layer 210 includes cobalt in an amount about or in any range from about 10, 15, 20, 25, 30, 35, 40, 45, and 50 at. %.

The thickness of the CoFeB alloy layer 210 is not intended to be limited. In one aspect, the thickness of the CoFeB alloy layer 210 is in a range from about 0.2 nm to about 3 nm. In another aspect, the thickness of the CoFeB alloy layer 210 is in a range from about 0.5 to about 2 nm. Yet, in another aspect, the thickness of the CoFeB alloy layer 210 is about or in any range from about 0.2, 0.4, 0.6, 0.8, 1.0, 1.2, 1.4, 1.6, 1.8, 2.0, 2.2, 2.4, 2.6, 2.8, and 3 nm.

In one aspect, the Fe layer 220 includes at least 98 at. % Fe. In another aspect, the Fe layer 220 includes at least 99 at. % Fe. Yet, in another aspect, the Fe layer 220 is substantially pure Fe. The Fe layer 220 may include other additional metals or non-metals. The thickness of the Fe layer 220 is not intended to be limited. In one aspect, the thickness of the Fe layer 220 is in a range from about 0.2 to about 2 nm. In another aspect, the thickness of the Fe layer 220 is in a range from about 0.2 to about 1.5 nm. Yet, in another aspect, the thickness of the Fe layer 220 is about or in any range from about 0.2, 0.4, 0.6, 0.8, 1.0, 1.2, 1.4, 1.6, 1.8, and 2.0 nm.

The CoFeB alloy layer 210 and the Fe layer 220 may be formed by any suitable deposition processes. Non-limiting examples of suitable deposition processes include PVD, CVD, and HDP CVD.

The metal oxide layer 150 is formed by sputtering (e.g., RF sputtering) of a metal oxide onto the Fe layer 220 as described above for FIG. 1. The cap layer 160 is formed on the metal oxide layer 150.

FIG. 3 illustrates a cross-sectional side view of a STT MRAM device with a free layer 140 including a magnetic layer 310, a spacer layer 320, a CoFeB layer 210, and an Fe layer 220. The STT MRAM device includes a MTJ 122 over a seed layer 110. The MTJ 122 includes a reference layer 120, a tunnel barrier layer 130 on the reference layer 120, and a free layer 140 on the tunnel barrier layer 130. The free layer 140 includes a magnetic layer 310, a CoFeB alloy layer 210, a spacer layer 320 between the magnetic layer 310 and the CoFeB alloy layer 210, and a Fe layer 220 on the CoFeB layer 210.

The magnetic layer 310 and the CoFeB alloy layer 210, which is also magnetic, are ferromagnetically coupled through the spacer layer 320. When a voltage source (see FIG. 1) generates the spin torque current (spin polarized current), the magnetic orientations (maintained in the same direction with respect to one another) of the magnetic layer 310 and the CoFeB alloy layer 210 are both flipped in the same direction according to the angular momentum of the spin torque current. Accordingly, when the free layer 140 is parallel to the reference layer 120, the resistance is low and the logic state is 0. When the free layer 140 is antiparallel to the reference layer 120, the resistance is high and the logic state is 1.

Non-limiting examples of suitable materials for the magnetic layer 310 include cobalt (Co), iron (Fe), boron (B), nickel (Ni), or any combination thereof. The thickness of the magnetic layer 310 is not intended to be limited. In one aspect, the thickness of the magnetic layer 310 is in a range from about 0.2 nm to about 2 nm. In another aspect, the thickness of the magnetic layer 310 is in a range from about 0.5 to about 1 nm. Yet, in another aspect, the thickness of the magnetic layer 310 is about or in any range from about 0.2, 0.4, 0.6, 0.8, 1.0, 1.2, 1.4, 1.6, 1.8, and 2.0.

Non-limiting examples of suitable materials for the spacer layer 320 include tantalum (Ta), titanium (Ti), titanium nitride (TiN), aluminum (Al), magnesium (Mg), titanium magnesium (TiMg), tantalum magnesium (TaMg), or any combination thereof. The thickness of the spacer layer 320 is not intended to be limited. In one aspect, the thickness of the spacer layer 320 is in a range from about 0.1 to about 1 nm. In another aspect, the thickness of the spacer layer 320 is in a range from about 0.2 to about 0.5 nm. Yet, in another aspect, the thickness of the spacer layer 320 is about or in any range from about 0.1, 0.2, 0.3, 0.4, 0.6, 0.6, 0.7, 0.8, 0.9, and 1.0 nm.

The metal oxide layer 150 is formed by sputtering (e.g., RF sputtering) of a metal oxide onto the Fe layer 220 as described above for FIG. 1. The cap layer 160 is formed on the metal oxide layer 150.

The magnetic layer 310 and the spacer layer 320 may be formed by any suitable deposition processes. Non-limiting examples of suitable deposition processes include PVD, CVD, and HDP CVD.

Figure 4:
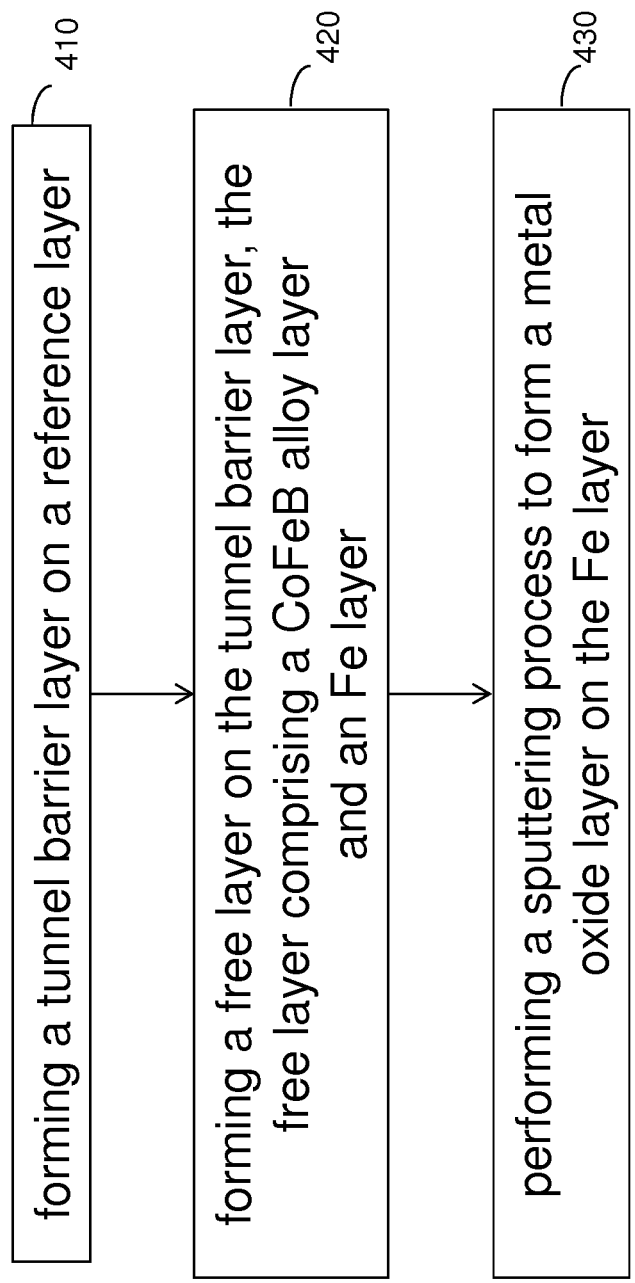
FIG. 4 is a flow diagram illustrating a method of forming a STT MRAM device.

FIG. 4 is a flow diagram illustrating a method of forming a STT MRAM device (see also, FIGS. 1-3). In box 410, the method includes forming a tunnel barrier layer on a reference layer. In box 420, a free layer is formed on the tunnel barrier layer. The free layer includes a CoFeB alloy layer and an Fe layer. In box 430, a sputtering process is used to form a metal oxide layer on the Fe layer. The methods described in boxes 410, 420, and 430 are described in further detail above for FIGS. 1-3.

EXAMPLE

Figure 5B:
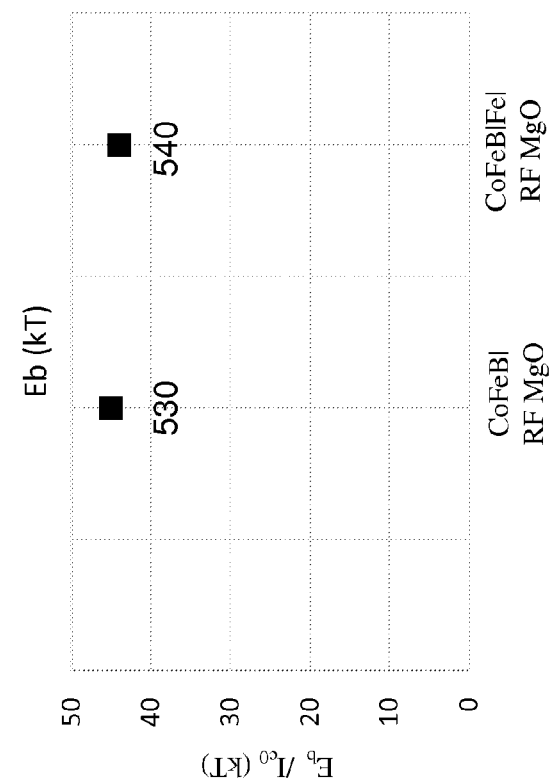
FIG. 5B is a graph comparing energy per bit ($E_b$) in STT MRAM devices with free layers including CoFeB alone and a combination of CoFeB and Fe layers.
Figure 5A:
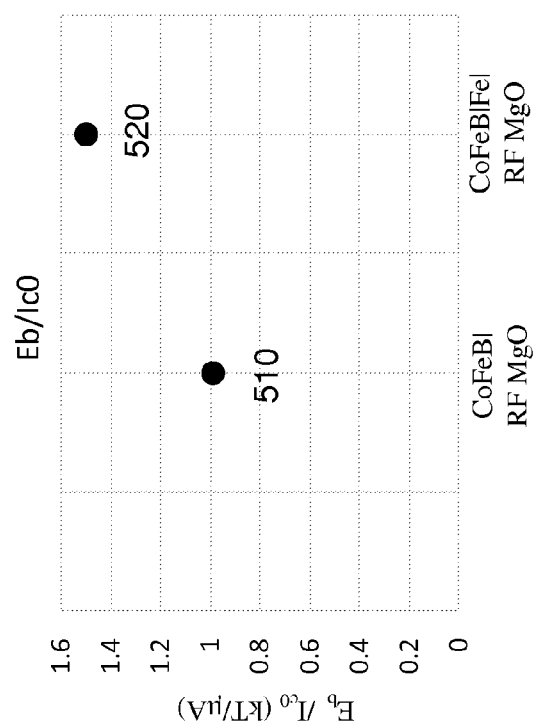
FIG. 5A is a graph comparing switching efficiency ($E_b/I_{c0}$) in STT MRAM devices with free layers including CoFeB alone and a combination of CoFeB and Fe layers.

FIG. 5A is a graph comparing switching efficiency ($E_b/I_{c0}$) in STT MRAM devices with free layers including CoFeB alone (510) and the combination of CoFeB and Fe (520). As shown, switching efficiency was improved by 50% in the CoFeB/Fe free layer device (520 compared to 510) at a given device size (see FIG. 1B). FIG. 5B is a graph comparing energy per bit ($E_b$) in STT MRAM devices with free layers including CoFeB alone (530) and the combination of CoFeB and Fe (540). As shown, both devices demonstrated similar energy per bit.

The above described STT MRAM devices and methods provide various advantages. The devices with free layers with a CoFeB and Fe layer combination and a metal oxide over the free layer demonstrate sufficiently strong PMA at a low switching current (e.g., at least 50% higher switching efficiency compared to STT MRAM devices with free layers of CoFeB alone). The method of making the devices, including forming a metal oxide layer over the free layer by sputtering provides advantages of increased control over the oxide layer thickness and, therefore, improved control of the junction resistance-area (RA) product, as well as the distribution of the RA in patterned devices. Compared to initially depositing a metal layer and then oxidizing the metal layer by an oxidation process, as described herein, the oxide cap layer is formed by RF sputtering from an oxide target.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a STT MRAM device, the method comprising:
    forming a tunnel barrier layer on a reference layer;
    forming a free layer on the tunnel barrier layer, the free layer comprising a magnetic layer, a CoFeB alloy layer, a spacer layer between the magnetic layer and the CoFeB alloy layer, and an Fe layer on the CoFeB alloy layer; and
    performing a sputtering process to form a metal oxide layer on the free layer.

2. The method of claim 1, wherein the CoFeB alloy layer comprises boron (B) in an amount in a range from about 20 to about 30 at. %.

3. The method of claim 1, wherein the CoFeB alloy layer comprises Fe in an amount in a range from about 20 to about 60 at. %.

4. The method of claim 1, wherein the CoFeB alloy layer comprises cobalt (Co) in an amount in a range from about 20 to about 40 at. %.

5. The method of claim 1, wherein the sputtering process is RF sputtering.

6. The method of claim 5, wherein the RF sputtering comprises sputtering a metal oxide onto the CoFeB alloy layer.

7. The method of claim 6, wherein the metal oxide is MgO, tantalum oxide (TaOx), titanium oxide (TiOx), aluminum oxide (AlOx), magnesium titanium oxide (MgTiOx), or any combination thereof.

8. A method of making a STT MRAM device, the method comprising:
    forming a tunnel barrier layer on a reference layer;
    forming a free layer on the tunnel barrier layer, the free layer comprising a magnetic layer, a CoFeB alloy layer, a spacer layer between the magnetic layer and the CoFeB alloy layers, and an Fe layer disposed on the CoFeB alloy layer; and
    performing a sputtering process to form a metal oxide layer on the free layer;

wherein sputtering process comprises RF sputtering a metal oxide onto the Fe layer under a pressure in a range from about 0.1 to about 10 milli-Torr (mTorr).

9. The method of claim 8, wherein the Fe layer comprises at least 99 at. % Fe.

10. The method of claim 8, wherein the free layer has a thickness in a range from about 0.6 to about 6 nm.

11. The method of claim 8, wherein the metal oxide layer has a thickness in a range from about 0.2 to about 2 nm.

12. The method of claim 8, wherein the sputtering process further comprises depositing the metal oxide at a deposition rate in a range from about 0.0005 nm/second to 0.005 nm/second.

* * * * *